(12) United States Patent
Carignan et al.

(10) Patent No.: US 11,513,148 B2
(45) Date of Patent: Nov. 29, 2022

(54) METHOD, SYSTEM AND SOFTWARE PRODUCT TO IDENTIFY INSTALLATIONS LIKELY TO EXHIBIT AN ELECTRICAL NON-CONFORMITY

(71) Applicant: HYDRO-QUEBEC, Montréal (CA)

(72) Inventors: Jean Carignan, Trois-Rivières (CA); Sylvain Gelinas, St-Élie de Caxton (CA); Alain Poulin, Shawinigan (CA)

(73) Assignee: HYDRO-QUEBEC, Montreal (CA)

( * ) Notice: Subject to any disclaimer, the term of this patent is extended or adjusted under 35 U.S.C. 154(b) by 0 days.

(21) Appl. No.: 17/284,420

(22) PCT Filed: Oct. 4, 2019

(86) PCT No.: PCT/CA2019/051425
§ 371 (c)(1),
(2) Date: Apr. 9, 2021

(87) PCT Pub. No.: WO2020/073117
PCT Pub. Date: Apr. 16, 2020

(65) Prior Publication Data
US 2021/0356508 A1    Nov. 18, 2021

(30) Foreign Application Priority Data
Oct. 11, 2018   (CA) ................. CA 3020432

(51) Int. Cl.
*G01R 31/08* (2020.01)
*H02J 13/00* (2006.01)
*G01R 21/133* (2006.01)

(52) U.S. Cl.
CPC ......... *G01R 31/088* (2013.01); *G01R 21/133* (2013.01); *H02J 13/00001* (2020.01); *H02J 13/00002* (2020.01)

(58) Field of Classification Search
CPC .......... H02J 13/00001; H02J 13/00002; G01R 31/086; G01R 31/088; G01R 21/133; G01R 22/066; Y02E 60/00; Y04S 10/30
(Continued)

(56) References Cited

U.S. PATENT DOCUMENTS

| 9,098,553 B2 | 8/2015 | McConky et al. |
| 10,684,346 B2 | 6/2020 | Leonard et al. |

(Continued)

FOREIGN PATENT DOCUMENTS

| CA | 2297327 A1 | 2/1999 |
| CA | 2353361 A1 | 7/2000 |

(Continued)

OTHER PUBLICATIONS

Notice of Allowance received for Canadian Patent Application No. 3115353 dated Dec. 29, 2021, 1 page.

(Continued)

*Primary Examiner* — John H Le
(74) *Attorney, Agent, or Firm* — Shook, Hardy & Bacon L.L.P.

(57) ABSTRACT

A method, a system and a tangible product and non-transitory computer program are provided to automatically identify electrical installations in an electrical distribution system that are likely to exhibit an electrical non-conformity (ENC). The method requires only electrical profiles collected from meters and IT tools, without the need for any other sub-metering equipment. The method includes the steps of recovering electrical profiles generated by the meters; applying algorithmic processing associated with indicators of an ENC on the profiles; and identifying electrical installations likely to exhibit an ENC, according to the indicators that have met their target conditions. The method may include the recovery of local meteorological data and (Continued)

nominal data related to the electrical installations to confirm or deny that the identified electrical installations are likely to be non-conforming.

29 Claims, 7 Drawing Sheets

(58) Field of Classification Search
USPC .......................................................... 702/182
See application file for complete search history.

(56) References Cited

U.S. PATENT DOCUMENTS

| | | | |
|---|---|---|---|
| 10,802,056 | B2 | 10/2020 | Leonard et al. |
| 11,181,568 | B2* | 11/2021 | Léonard ............ H02J 13/00001 |
| 2009/0045976 | A1 | 2/2009 | Zoldi et al. |
| 2011/0301894 | A1 | 12/2011 | Sanderford, Jr. |
| 2012/0123995 | A1 | 5/2012 | Boot |
| 2015/0323344 | A1 | 11/2015 | Arlitt et al. |

FOREIGN PATENT DOCUMENTS

| | | |
|---|---|---|
| CA | 2137067 C | 12/2001 |
| CA | 2819916 C | 7/2003 |
| CA | 2303064 C | 4/2006 |
| CA | 2607352 A1 | 11/2006 |
| CA | 2647578 A1 | 6/2009 |
| CA | 2710663 A1 | 7/2009 |
| CA | 2736000 A1 | 3/2010 |
| CA | 2745078 C | 6/2010 |
| CA | 2753074 A1 | 6/2010 |
| CA | 2689776 A1 | 7/2010 |
| CA | 2813534 A1 | 3/2012 |
| CA | 2857391 C | 6/2013 |
| CA | 2880502 A1 | 2/2014 |
| CA | 2884609 A1 | 3/2014 |
| CA | 2814748 A1 | 9/2014 |
| CA | 2915066 A1 | 12/2014 |
| CA | 2825320 C | 6/2016 |
| CA | 2936212 A1 | 1/2018 |
| WO | WO/2017/100916 A1 | 6/2017 |
| WO | WO2018010028 A1 | 1/2018 |
| WO | WO2020077443 A1 | 4/2020 |

OTHER PUBLICATIONS

Extended European Search Report and Opinion received for European Patent Application No. 19871912.2, dated Jun. 10, 2022, 14 pages. (English translation not available).

* cited by examiner

METHOD, SYSTEM AND SOFTWARE PRODUCT TO IDENTIFY INSTALLATIONS LIKELY TO EXHIBIT AN ELECTRICAL NON-CONFORMITY

PRIORITY APPLICATION

This application claims priority on Canadian application No. 3.020.432, filed on Oct. 11, 2018, which is incorporated herein by reference.

FIELD OF INVENTION

The invention relates to a system and a method of detecting electrical installations likely to exhibit an electrical non-conformity (ENC), through the application of algorithmic processing on electrical profiles produced by new generation meters (NGM).

CONTEXT

Most electrical utilities have replaced or are in the process of replacing electromechanical meters with NGMs. These meters automatically transmit the measured parameters to a central data acquisition system at regular time intervals.

The large-scale deployment of NGMs makes large amounts of information relating to the various loads (customers' electrical installations) connected to the electrical distribution network (energy, voltage, current, etc.), available. This information opens up a range of new opportunities for, among other things, grid control and planning.

With the widespread deployment of NGMs, meter reading is now performed remotely and automatically. Thus, the presence of meter-reading technicians in the field is becoming increasingly rare. This new way of operating deprives network managers of an important source of potential NGM reporting.

This situation therefor created a new need to automatically identify electrical installations likely to exhibit an ENC.

SUMMARY

According to a first aspect of the invention, a method is proposed for automatically detecting electrical installations likely to exhibit an ENC on an electrical distribution network. The electrical installations are connected to meters. The method includes the steps of:
  a. retrieving, from a database associated with a meter data management system, electrical profiles associated with the electrical installations, the profiles being generated by said meters deployed by electrical utilities for billing purposes, the profiles being spread over time;
  b. applying, using one or more computing devices, algorithmic processing associated with ENC indicators determined according to target conditions, on the electrical profiles collected in step a), in order to obtain data indicative of different types of ENC;
  c. detecting, by the one or more computing devices, from the data obtained in step b), the said electrical installations likely to exhibit an ENC, when the target conditions are met.

Advantageously, the developed method requires only the electrical profiles recovered from meters and IT tools applied by the one or more computing devices to detect electrical installations likely to be non-conforming, without recourse to any other sub-metering equipment.

Without being limited to the scope of the present invention, the method may include a step of retrieving nominative data characterizing the electrical installations, and a step of confirming or denying that the electrical installations identified in step c) are indeed likely to exhibit an ENC, by cross-referencing said nominative information with ENC indicators that have met their target conditions.

The nominative data may include at least one of the following information for each electrical installation: the nature of the electrical installation, either single-phase or multi-phase; the rate to which the electrical installation is subject; the purpose of the building(s) associated with the electrical installation (residential, commercial, institutional or industrial); and the main source of energy used to heat the building(s).

The method can also include a step to select all or part of the ENC indicators to be applied to the profiles, based on the information contained in the nominative data.

The method can also include the recovery of meteorological data, and confirm or deny that the identified electrical installations are likely to exhibit an ENC, by cross-referencing said meteorological data with the ENC indicators that have met their target conditions. Meteorological data may include, for example, the local outdoor temperature, date and time determined at the time the electrical profiles were generated.

The method preferably includes a step of identifying the nature of the electrical installations, either single-phase or multi-phase, based on the collected profiles and/or nominative information. The electrical profiles from single-phase and two-phase installations include at least voltage (in V) and active energy (in kWh) profiles. For multi-phase electrical installations, the collected profiles include the active energy (in kWh) total and per electrical phase ($\phi_A$, $\phi_B$, $\phi_C$), a measurement of apparent energy (in kVAh) total and per electrical phase, a measurement of reactive energy (in kVARh) total and per electrical phase, a measurement of voltages (in V) per phase and a measurement of current (in A) per phase.

The validation of an ENC is carried out according to the existence of indicators having met their target condition and their values. For certain types of indicators, when the degree of certainty is high (probability of 100% for example), it is possible to automatically interrupt the supply of electricity to a given installation, the degree of certainty being related to the number, the occurrence and the type of ENC indicators having met the target conditions.

Part of the ENC indicators may be stand-alone indicators and other indicators may be relational indicators. An ENC indicator is considered to be autonomous if its algorithmic processing only involves data from the analyzed profiles of the installation. For their part, relational indicators involve the profiles of neighboring installations, i.e. which are connected to the same distribution transformer, to the same electrical phase, to the same electrical line or to the same distribution station.

Preferably, some of the algorithmic processing is associated with a first class of ENC indicators called state indicators. Depending on the method, one or more of the state indicators can be computed, including an energy data capture rate; a voltage data capture rate; a voltage de-balancing; a current de-balancing; and the ratio of apparent and active energy. The IT tools thus validate, based on the calculated state indicators, the probability that the electrical installations identified in step c) are non-conforming installations.

Part of the algorithmic processing can be associated to a second class of ENC indicators called positioning indicators.

In this case, the IT tools determine, with the calculated positioning indicators, if a given electrical installation is located on the analyzed power line, but is connected to another transformer than the one defined in the nominative data; or if a given installation is not connected to the analyzed line. The IT tools thus validate, from the calculated positioning indicator, a probability that the electrical installations identified in step c) are non-conforming installations.

Part of the algorithmic processing can also be associated with a third class of ENC indicators, i.e. non-technical loss indicators. Different algorithmic processing is associated with subclasses of the class of non-technical loss indicators. Thus, algorithmic processing is associated to a first subclass of non-technical loss indicators, for which one or more indicators of meter manipulation or defective meters are calculated, including indicators of voltage coil alteration; identical energy data; identical voltage data; resistance in series on a current transformer; and zero three-phase current with non-zero consumption. The IT tools thus validate, based on the calculated non-technical loss indicator data, the probability that the electrical installations identified in step c) are non-conforming installations. For example, the "voltage coil alteration" indicator enables the identification of meters with a modified coil.

Another part of the algorithmic processing can be associated with a second subclass of non-technical loss indicators, for which one or more indicators of anomalies by comparison are calculated, including for example: a night consumption indicator; a single-phase mean value voltage deviation indicator; an inter-phase mean value voltage deviation indicator; an inter-customer mean value voltage deviation indicator; a multi-phase transformer mean value voltage deviation indicator; a zero consumption voltage level indicator; a current ratio indicator; or a non-synchronized voltage loss and return indicator. The IT tools thus validate, based on the data indicative of anomalies by comparison, a probability that the electrical installations identified in step c) are non-conforming installations.

Another part of the algorithmic processing may be associated with a third subclass of non-technical loss indicators, for which an indicator(s) of inadequate meter connections or components are calculated, including for example an indicator of no current; an indicator of no voltage; an indicator of negative energy data; or an indicator of zero voltage with current. The IT tools thus validate, based on the data indicative of inadequate meter connections or components, the probability that the electrical installations identified in step c) are non-conforming installations.

Another part of the algorithmic processing can be associated to a fourth subclass of non-technical loss indicators, for which a transient aberrations indicator is calculated, identifying large voltage deviations on the analyzed profiles. The IT tools thus validate, from the data indicative of transient aberrations, a probability that the electrical installations identified in step c) are non-conforming installations.

Another part of the algorithmic processing may be associated with a fifth subclass of non-technical loss indicators, for which one or more non-standard way of operating indicators are calculated, including, for example, a dual-energy heating indicator; a non-standard peak power indicator; a non-standard medium voltage indicator; an indication of a single-connection transformer; a disparate determination factor; a validation of the active energy consumed; a non-standard voltage with current. The IT tools thus validate, based on the data indicative of the non-standard way of operating, the probability that the electrical installations identified in step c) are non-conforming installations.

Finally, another part of the algorithmic processing can be associated to a sixth subclass of non-technical loss indicators, for which one or more non-conforming cyclic electrical load indicators are computed, including for example the application of a Fourrier transformation on the profile data and a cyclic voltage indicator without power demand. The IT tools thus validate, from the data indicative of non-conforming cyclic loads, a probability that the electrical installations identified in step c) are non-conforming installations.

The method preferably includes a step to generate a structure of results including the indicative data of the different types of potential ENCs identified for each electrical installation and a step to generate graphs visually representing the identified potential ENCs. It is also possible to generate, via a software application, requests for inspection of electrical installations identified as likely to exhibit a potential ENC. The IT tools can also assign a priority to the electrical installations identified as likely to exhibit an ENC, according to a degree of certainty as for the existence of an ENC for a given installation, the degree of certainty being related to the number, the occurrence and the type of ENC indicators having met the target conditions.

The automatic developed method is particularly effective when the measurements of the electrical profiles of the meters are taken at least once an hour.

In an optional embodiment, the method includes a step of automatically interrupting the electricity supply for at least some of the electrical installations identified in step c), e.g. by sending a request to open a control element located in the meter related to the electrical installation identified as non-conforming.

According to another aspect of the invention, a system for automatically identifying the electrical installations that are likely to exhibit an ENC on an electrical distribution network is also proposed. The system includes at least one algorithmic processing unit having a processor and memory in communication with the processor. The memory includes instructions that can be executed by the processor to carry out the steps described above. The system may also include one or more databases for saving the calculated ENC indicators; the electrical profiles generated by the meters; and unique identifiers associated with the electrical installations of the network which are likely to exhibit an ENC. Meteorological data and nominative data can also be saved there. The topology of the distribution network can also be saved there.

According to a preferred embodiment, the system may include means for sending a request to open a control element located in the meter linked to the electrical installation identified as being non-conforming.

Finally, according to another aspect of the invention, a tangible and non-transitory computer program product is provided, to automatically identify the installations likely to exhibit an ENC on an electrical distribution network. The product includes instructions that can be executed by one or more processors for carrying out the steps described above.

The developed method and described in more detail below can be applied to power lines (electrical arteries), substations or even to specific regions grouping together one or more customers. This group of clients is hereby referred to as the "electrical scope" of the processing.

BRIEF DESCRIPTION OF THE DRAWINGS

A detailed description of the invention will be given below with reference to the following drawings.

DETAILED DESCRIPTION

Figure 1:
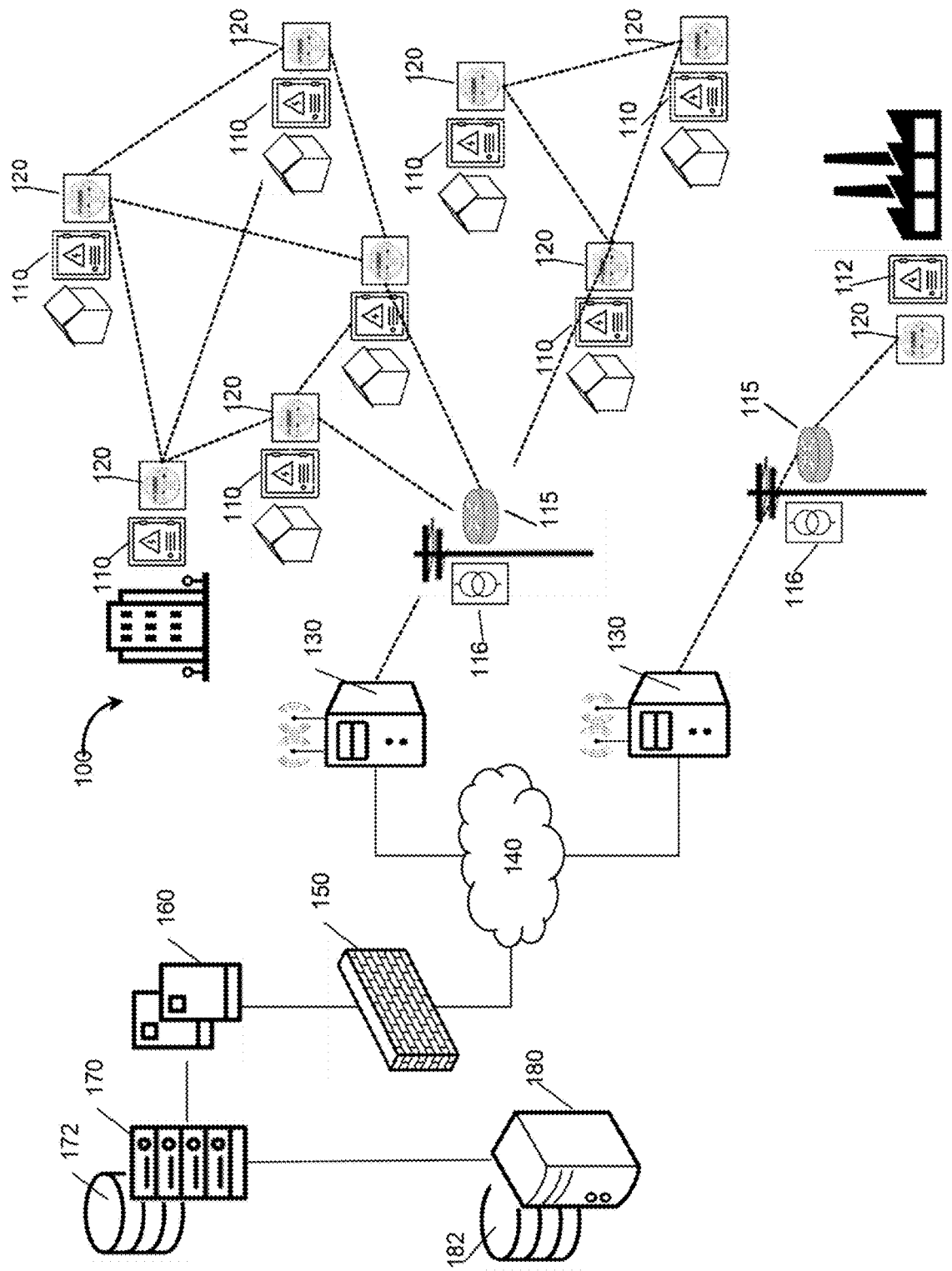
FIG. 1 shows a representation of an advanced metering infrastructure in which the proposed method is integrated to automatically detect electrical installations likely to exhibit an ENC.

In the context of the following description, an electrical profile or simply "profile" is defined as a time series of an electrical input, staggered or spread over time. This electrical input can be a measure of an active energy consumption, an apparent energy consumption, a reactive energy consumption, a voltage, a current or any other variable of an electrical nature. The electrical profiles from single-phase and two-phase installations include at least voltage (in V) and active energy (in kWh) profiles while for multi-phase electrical installations, the collected profiles include total active energy (in kWh) and by electrical phase ($\phi_A$, $\phi_B$, $\phi_C$), a measurement of total apparent energy (in kVAh) and by electrical phase, a measurement of reactive energy (in kVARh) total and by electrical phase, a measurement of voltages (in V) per phase and a measurement of the currents (in A) per phase.

In the context of the following description, the profiles used are produced by a meter. A meter is an electrical measurement component integrated into an advanced metering infrastructure that produces, among other things, electrical profiles from an electrical installation connected to a low voltage network (for example, a network where the nominal voltage between phases does not exceed 750V) or medium voltage network (for example, where the nominal voltage between the phases is more than 750 V and less than 44,000 V). These meters, whose main function is energy measurement for billing purposes, are sometimes referred to as electric meters, smart meters, communicating meters, or next generation meters (NGMs).

In the context of the following description, the profiles produced by the meters are processed by IT tools, including applications and algorithms, making it possible to identify electrical installations likely to exhibit an electrical non-conformity (ENC). The term "IT tools" is understood to mean computing devices, such as computers and/or servers, databases and software applications capable of applying algorithmic processing to the electrical profiles. Computers and/or servers include one or more algorithmic processing units, including one or more processor(s) and one or more data storage (memory). The term "computing device" encompasses computers, servers and/or specialized electronic devices which receive, process and/or transmit data. "Processing devices" are generally part of "systems" and include processing means, such as microcontrollers and/or microprocessors, CPUs or are implemented on FPGAs, as examples only. The processing means are used in combination with storage medium, also referred to as "memory" or "storage means". Storage medium can store instructions, algorithms, rules and/or trading data to be processed. Storage medium encompasses volatile or non-volatile/persistent memory, such as registers, cache, RAM, flash memory, ROM, as examples only. The type of memory is of course chosen according to the desired use, whether it should retain instructions, or temporarily store, retain or update data. Steps of the proposed method are implemented as software instructions and algorithms, stored in computer memory and executed by processors. It should be understood that servers and computers are required to implement to proposed system, and to execute the proposed method. The IT tools can be centralized or distributed. The term "ENC" is understood to mean anomalies related to the electrical position of the meters, deviations from the operating standards established by the electrical utilities and anomalies associated with the measurement process. The latter category is called "non-technical losses" and includes energy theft. These ENCs can be associated with the electrical installations of customers whose nature of the connection can be single-phase or multi-phase.

In the context of the following description, the term "customer" is understood to mean each of the users connected to the low-voltage or medium-voltage electrical network. This connection is made via an electrical installation. An electrical installation is understood to mean the electrical components required to supply a customer's electrical loads. Without being limited to the scope of the present invention, most installations have at least one meter adapted to the nature and magnitude of the load, and one or more distribution panels also adapted to the nature and magnitude of the load. The electrical panels allow the distribution of electricity to the customer's various electrical equipment.

Most of the existing solutions for detecting the presence of an ENCs, which may be indicative of energy theft, involve the addition of sub-metering equipment to the electrical distribution network. This sub-metering equipment, such as meters or current sensors, is installed upstream of customers' electrical installations and makes it possible to make energy or current balances in an electrical cell or at a current node (Kirchhoff's law). The sub-metering infrastructure thus added, in addition to the existing meters associated with customers' electrical installations (NGM meters described above), involves substantial costs, linked to its acquisition, deployment and maintenance. The invention described in the following paragraphs relates to a method, a system and a tangible computer program product for the identification or detection of electrical installations likely to exhibit an ENC, without resorting to the addition of sub-metering equipment.

The proposed system and method differ from existing solutions in that they only use electric profiles generated by meters associated with customers' electrical installations and from the IT tools developed. The data transmitted by the meters and retrieved in the form of profiles are conditioned in order to apply different algorithmic processing, each of these processing being linked to a given ENC indicator. The values generated by the indicators also make it possible to specify the nature and importance of an ENC. The results of the different algorithmic processing are compared to target conditions, varying from one indicator to another. ENC indicators can take different values, such as false or true, a percentage, a ratio, a score, etc. Electrical installations likely to exhibit an ENC are identified using indicators that have met or fulfilled their target conditions. Some of the indicators are specialized for single-phase electrical installations, while others are used for an ENC detection in multi-phase electrical installations. Indicators can also be autonomous or relational in nature. An ENC indicator is considered to be "autonomous" if its algorithmic processing only involves data from the profiles of the installation analyzed. In the event that the algorithmic processing of an ENC indicator requires data from profiles of electrically neighboring facilities, that indicator is considered to be "relational". Electrically neighboring installations, hereby referred to as "neighboring installations", are understood to mean all the installations which are connected to the same distribution transformer, or to the same electric phase or to the same electric line or even to the same distribution station.

FIG. 1 shows the various components necessary for carrying out the method allowing the identification of electrical installations likely to exhibit an ENC, including the components, at an early stage in the process. It shows a simplified electrical distribution network (100), which includes a plurality of single-phase electrical installations (110), and multi-phase electrical installations (112). Although few electrical installations are shown in FIG. 1, it should be noted that an electrical distribution network can have several thousand or even several million electrical installations. The electrical installations are connected to transformers (116), which themselves are connected to electrical lines or arteries of the distribution network (100). The latter converge towards distribution stations, not shown in FIG. 1.

Each electrical installation (110, 112 and 120) is connected to a distribution transformer (116). Each meter (120) comprises measuring means and data transmission means. The measurements taken by the meter (data and profiles) are thus routed to a data management system (170), called "MDMS", short for Meter Data Management System. Each meter also includes control means for interrupting the power supply to the electrical installation to which it is linked. These means can be activated by sending a signal from the central monitoring and management system (request to open a control element located in the meter), to the meter. Thus, it is possible, using the tools developed for the present invention, to interrupt the supply of electricity by sending a request to open a control element located in the meter linked to the electrical installation determined to be non-conforming.

The MDMS (170) includes a database (172) to store the raw data transmitted by the meters. The MDMS (170) and the database (172) can be located on one or more servers, located in the same building, or can be distributed, between several servers, in different locations, for example in a cloud data infrastructure.

As shown in FIG. 1, the meters do not communicate directly with the MDMS. The meters can relay information between themselves or send it directly to a router (115). The routers communicate with collectors (130), which in turn transmit the information to the MDMS (170) via a Wide Area Network (WAN) (140). The data taken by the meters is then routed to a front-end data acquisition system (160) and then to the MDMS (170). A firewall security system (150) is used to protect the meter data. Of course, other network configurations can also be considered.

The implementation of the method of identifying electrical installations likely to exhibit an ENC is carried out using computing devices and specifically designed IT tools, including a specialized software application. This application is deployed in a computer system (180) which may include an algorithmic processing unit, including one or more processors and a central or distributed storage memory. The system (180) may also include one or more servers and a database (182). The latter is used to store, among other things, electrical profiles from the MDMS, distribution network topology data (from the Geographic Information System (GIS) of the electrical utility), nominative data related to a meter and an electrical installation (also called "customer vectors") and meteorological data indicative of local weather conditions. The database can also store other information described in more detail below, including, for example, calculated ENC indicators and unique identifiers associated with electrical installations.

Figure 2:
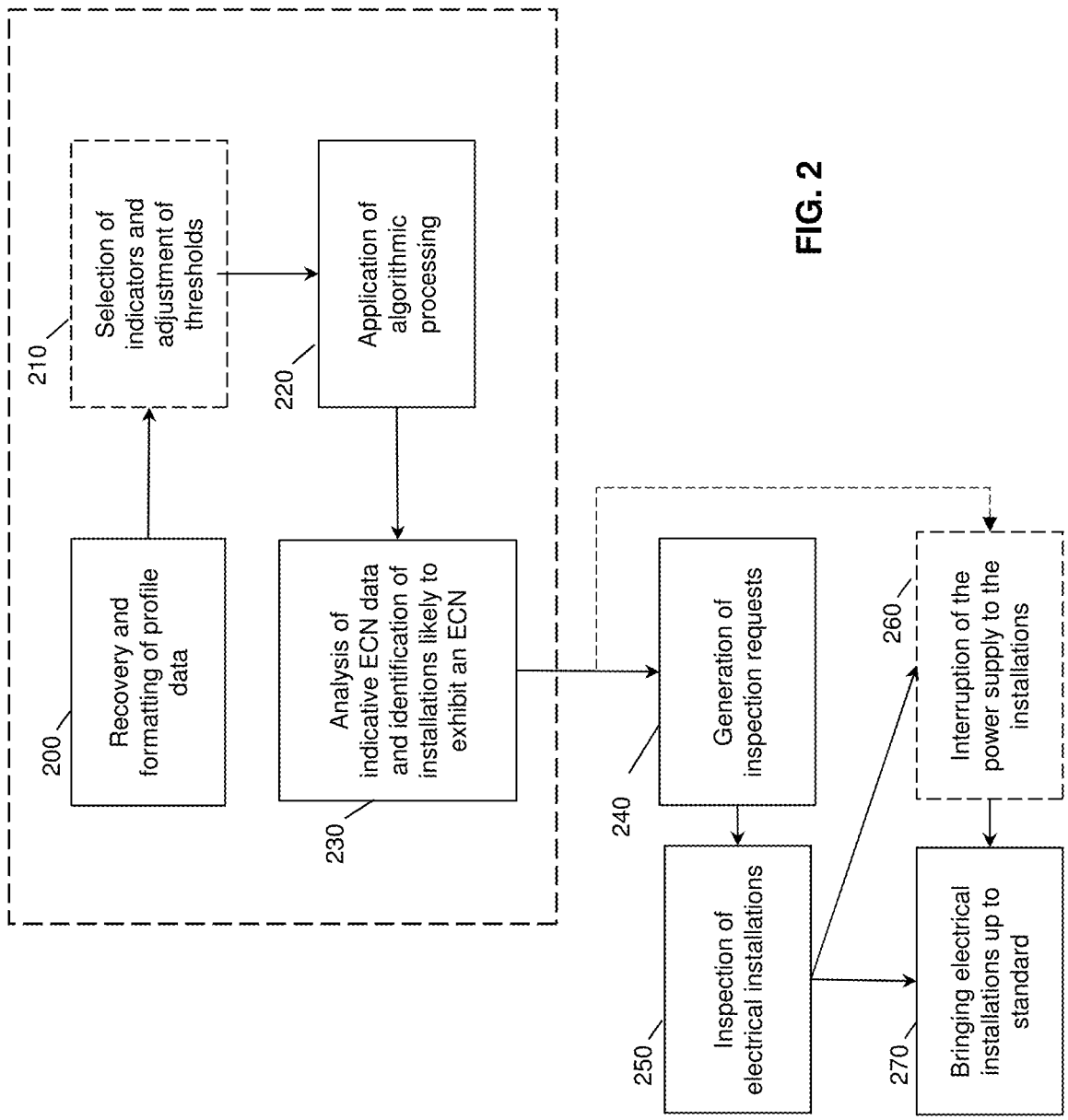
FIG. 2 shows a diagram, at a high level, of the overall steps of the method of detecting electrical installations likely to exhibit an ENC, according to a preferred embodiment.

FIG. 2 shows the global process in which the method of automatic detection of the electrical installations likely to exhibit an ENC and this via the application of various algorithmic processing associated with the various indicators of an ENC. This process is segmented into different steps. The first step consists (200) in the recovery of the electrical profiles. This step involves retrieving, from the database associated with the meter data management system, the electrical profiles associated with the electrical installations. This step can also include the extraction of additional data, including for example nominative data, the topology of the electrical distribution network, the meteorological data, and other data used for the application of the algorithmic processing. According to a preferred embodiment, it is possible to select the extent of the processing in both electrical and temporal terms. From an electrical point of view, the processing can be carried out at the level of the transformer, a phase, a line or a distribution station. From a temporal point of view, the processing period can vary from a few hours to several days or even a few months depending on the level of precision and the type of information required.

The second step (210), which is optional, allows receiving a selection of the indicators to be calculated as well as the level of the different thresholds to be applied for the target conditions. This step is optional since all indicators can be applied by default. An ENC indicator is the result of an algorithmic processing applied on at least one electrical profile and which can be compared to a target condition in order to identify an ENC. According to a preferred embodiment, it is possible for the system to receive an indicator selection, via a specialized application, of only some (a subset) of the ENC indicators to be applied to the analyzed profiles, and this according to the nature of the electrical installation of the customer or according to the type of desired research. The specialized application also makes it possible to modify the target conditions, by adjusting the default values of the different thresholds and constraints (voltage, current, period of time, number of occurrences, etc.) thus allowing to manage the behavior and sensitivity of the algorithmic processing associated with the indicators. The adjustment of thresholds can for example be carried out following field inspections, confirming or denying non-conformities. To increase or decrease the sensitivity of certain indicators, thresholds can be adjusted retroactively, depending on the inspection results. It may also be possible to adjust thresholds by region or distribution station.

The third step (220) makes it possible to apply, to the profiles of each of the installations included in the selected electrical range (200), the algorithmic processing operations specific to each of the selected indicators (210). For each of the calculated indicators, a verification is carried out in relation to the target conditions. When at least one of the indicators meets its target conditions, the electrical installation from which the profiles under study originate is deemed likely to exhibit an ENC and an entry is added to the results file or to a database.

The fourth step (230) consists of an analysis of the indicators that have fulfilled their target conditions in order to identify the electrical installations that are likely to exhibit an ENC. Depending on the number of indicators, their occurrence and type, a degree of certainty, or likelihood, that an ENC is exhibited can be assessed. According to a preferred embodiment and in certain specific cases, the analysis can lead directly to the interruption of the power supply to the installation (260) as long as as the degree of certainty of the presence of an ENC is fairly high. Otherwise, a detailed analysis of the data of the electrical installation can be carried out in order to confirm or deny the potential ENC. The identification of an electrical installation likely to exhibit an ENC is not based solely on the detection of a single indicator observed at a specific time, but rather on a set of indicators and/or a certain recurrence of indicators. When the potential ENC is maintained, an inspection request is automatically issued (240) and an inspection (250) of the electrical installations is carried out. Finally, for the cases of an ENC validated by an inspection, a restoration of conformity of the installations is carried out (270), preceded or not by an interruption of the power supply (260) and this according to the result of the inspection and the nature of the ENC.

Figure 3:
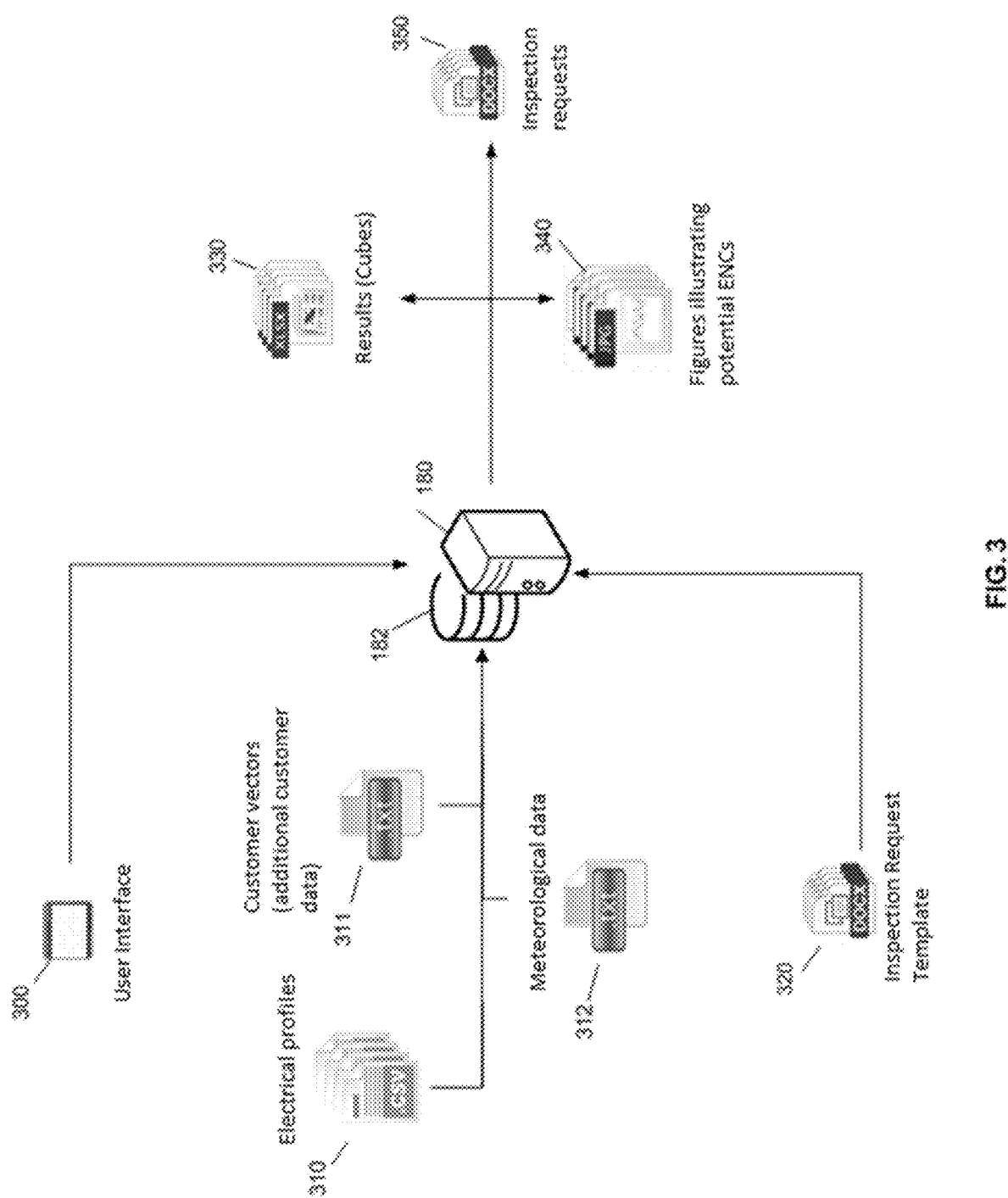
FIG. 3 schematically shows the flow of data and information associated with the method of detecting electrical installations likely to exhibit an ENC, according to a preferred embodiment.

FIG. 3 illustrates the flow of data and information associated with the process of identifying electrical installations likely to exhibit an ENC, according to a preferred embodiment. Although the inputs and outputs are illustrated in the form of files (csv, txt, docx or jpg), they can take various other forms, for example, those coming from or supplying a database.

According to a preferred embodiment, the system receives a selection, via the user interface of a specialized application (300), of all the processing control parameters. Without being limited to the scope of the present invention, these parameters can correspond, among others, to the electrical and temporal extent of the processing to be applied, the indicators to be calculated and the thresholds and constraints associated with each of them.

The electrical profiles (310) correspond to the electrical measurements generated by the meters. The system can prioritize the profiles by adding the topology of the electrical distribution network and by cross-referencing the profile data with the network topology data from the GIS of the electrical utility. Using the network topology, the system can associate the different galvanic links connecting a customer's electrical installations to the distribution station i.e. transformer, phase, artery. Some galvanic links can be questioned through the calculation of positioning indicators.

Nominative data, sometimes referred to as "customer vectors", (311) contains data to characterize customers' electrical installations. Customer vectors include at least one of the following information: the nature of the electrical installation (single-phase or multi-phase); the billing to which the electrical installation is subject; the building's use (residential, commercial, institutional or industrial) or the main source of energy used for heating the building(s). This nominative data is recovered by the system, from the database 182, and used for the selection of algorithmic processing to be applied to the electrical profiles of the installation or for the validation of potential ENCs. Algorithmic processing can then cross-reference the ENC indicators that have met their target conditions with the nominative data to confirm or deny that the electrical installations identified in step c) are likely to exhibit an ENC. For example, it is possible that an electrical installation may consume very little energy, even during the winter, if the customer's heating type is wood or gas, in comparison to neighbouring installations that use electric heating. Cross-referencering the type of heating (or main source of energy) for a given electrical installation, as provided in the nominative data, with the electrical profile allows the system to confirm or deny whether the installation is likely to exhibit an ENC.

The meteorological data (312) includes at least a local outdoor temperature profile corresponding to the study period (date and time to specify the temporal range). The meteorological data can be recovered by the system, and used in the algorithmic processing associated with certain indicators or can be used to confirm or deny a potential ENC. Again, a consumption peak for facilities in a given region can be explained by a period of extreme cold. Thus, an ENC detected in step c) can be validated with additional data (nominative and meteorological).

At the end of the processing, according to a preferred embodiment, the results are compiled into a data structure or structure of results, also known as a "cube" (330). The data structure includes, at a minimum, for each installation likely to exhibit an ENC, the list of indicators that have met their target conditions, the value of the indicators, and one or many unique identifiers to distinguish between installations on an electrical distribution system. The unique identifier may include, for example, the street address or serial number of the meter associated with the installation. Some information from the nominative data (311) can also be added to the structure of results to facilitate the production of inspection requests. The structure of the results can also include figures or graphs making it possible to show the ENC indicators that have fulfilled the target conditions, such as those shown in FIGS. 5, 6 and 7. The content of the structure can be exported in different file formats or saved directly in a database. The results can be grouped by lines, distribution stations or regions, depending on the electrical extent of the processing.

In the event that no analysis or additional information is available to deny a potential ENC associated with a customer's electrical installation, an inspection request (350) for the said electrical installation is automatically generated by the system, using the specialized software application. The use of a pro-formatted template (320) allows the system to automatically generate an inspection request. This request contains the information required for the inspection, i.e. minimum information, the customer's personal information, the nature of the suspected ENC and the inspection priority level automatically assigned. The priority can be determined by the system according to the degree of certainty as to the existence of the ENC(s) for the said installation. A figure or a graph (340) illustrating the circumstance having led to the identification of the potential ENC can also be generated by the system and added to the inspection request. It is the inspection of an installation that will provide the final and unequivocal confirmation of the presence of an ENC.

Based on the inspection results obtained, feedback of the default values of thresholds and constraints of the ENC indicators can be determined in order to increase the overall performance of the detection method. This performance, expressed as a percentage of likelihood or degree of certainty, is defined as the ratio of the number of confirmed ENC cases to the total number of ENC cases that have been inspected or power supplies interrupted.

Figure 4:
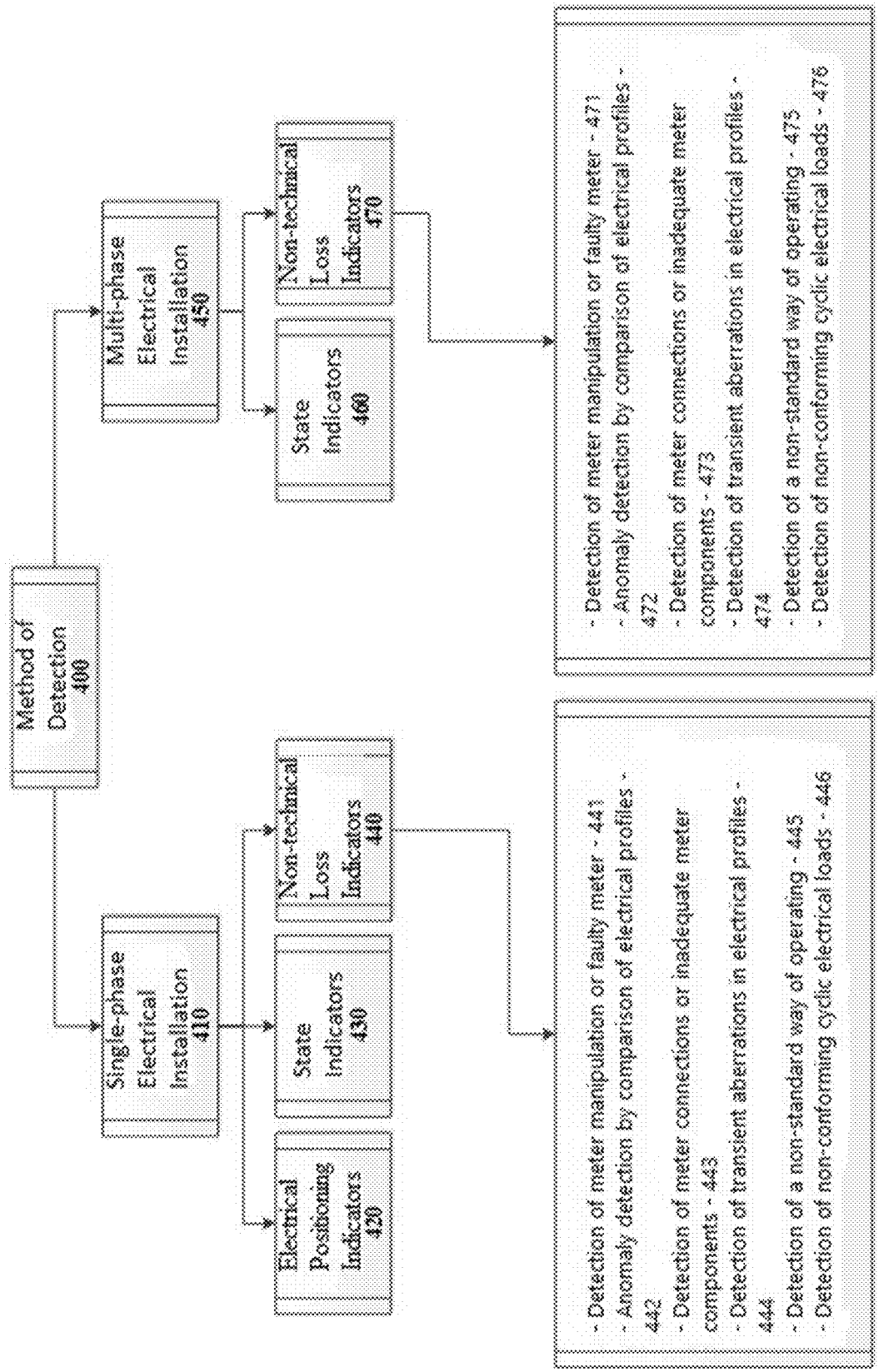
FIG. 4 shows a classification of the indicators used in the method of detecting electrical installations likely to exhibit an ENC.

FIG. 4 shows a classification of the different ENC indicators that have been created, according to a preferred embodiment of the proposed method (400). The first level of classification makes it possible to distinguish between ENC indicators applied to single-phase (410) and multi-phase (450) electrical installations. Under these levels, three classes of indicators can be defined: a first class of indicators called "electrical positioning indicators" (420); a second class of indicators called "state indicators" (430 and 460); and a third class of indicators called "non-technical loss indicators" (440 and 470). This last class groups together anomalies that affect the measurement of electrical energy and includes several subclasses of indicators.

The "electrical positioning indicators" (420), specific to single-phase installations, allows the system, through statistical and electrical analysis, to confirm or deny the accuracy of the galvanic link that connects a customer's electrical installation (120 in FIG. 1) to its distribution transformer (116 in FIG. 1) and its belonging to the line being analyzed. As long as the galvanic link is validated, no particular attribution is made to the electrical installation. Otherwise, if the positioning indicators show that the customer's installation still appears to belong to the power line under analysis, then the installation is given the characteristic of "installation or customer incorrectly located". If, on the contrary, the indicators show that the customer's installation does not appear to belong to the power line being analyzed, then the installation is given the status of "OUT", i.e. installation does not belong to the line being analyzed. The method thus also include a step to validate, as explained above, from the calculated indicative positioning data, a probability that the electrical installations identified in step c) are non-conforming installations. In this example, if the positioning indicator is set to "out", than the likelihood that the electrical installation is non-confirming is low, since the positioning of the electrical installation is simply mislocated, but not necessarily non-conforming.

"State indicators" (430 and 460) are indicators that provide a better understanding of the electrical operating conditions, or operating-mode, of a customer's installation. These indicators, taken individually or as a whole, are calculated by the one or more processing devices of the system to confirm or deny the existence of a potential ENC. The presence of a state indicator in the structure of results can also lead, directly and after analysis, to the existence of an ENC. For example, a status indicator can highlight a non-standard lack of data in the voltage or consumption profiles of a single-phase installation or show a voltage or current imbalance in a multi-phase installation. State indicators may include one or more of the following indicators: energy data capture rate; voltage data capture rate; voltage de-balancing; current de-balancing; apparent and active energy ratio. As with the positioning indicators, a probability that the electrical installations identified in step c) are non-conforming installations can be validated by the system from the calculated state indicator data. The confirming can be conducted by the system by comparing state indicator values with standard threshold values, and confirm the non-conformity of an electrical installation more than X number of indicators exceed their corresponding thresholds.

"Non-technical loss indicators" (440 and 470) are indicators that reveal, using the execution of algorithms, potential electrical anomalies that affect the measurement of the electrical energy consumed. This class can be subdivided into subclasses. In the representation in FIG. 4, six (6) subclasses have been established. It is specified that other subclasses of ENC indicators can be defined.

The various subclasses of technical loss indicators include: the detection of meter tampering or of a defective meter (441 and 471); the detection of anomalies by comparing electrical profiles (442 and 472); the detection of meter connections or inadequate meter components (443 and 473); the detection of transient aberrations in electrical profiles (444 and 474); the detection of a non-standard way of operating or operating-mode (445 and 475); and the detection of non-conforming cyclic electrical loads (446 and 476).

The following paragraphs describe in more detail the different subclasses of non-technical loss indicators. It is important note that an indicator may be found in one or more subclasses. This is the case, for example, of the indicator that detects negative values in active consumption profiles. The existence of negative values can be attributed to the subclass "detection of meter tampering or a faulty meter", while also being part of the subclass of indicators revealing a non-standard operation.

Concerning a first subclass "detection of a meter manipulation or a faulty meter" (441 and 471), this subclass groups together all the indicators whose result of the algorithmic processing can be explained by a meter manipulation or a malfunction of the meter. For example, the system uses one of the autonomous indicators in this subclass to analyze the voltage profile of a single-phase installation. If this profile shows an average voltage in the order of 50% of the nominal voltage, the system is configured to detect that either the meter is faulty or that a manipulation of the voltage coil connections has been intentionally made. On the other hand, if the voltage level is variable over time and therefore arbitrary, the system is configured to determine that a malfunction of the meter can be suspected. Without being limited to the scope of the present invention, indicators in this subclass may be calculated by the one or more processing devices and include: alteration of the voltage coil; identical data in energy; identical voltage data; resistance in series on current transformer; and zero three-phase current with non-zero consumption. As per the example provided above, the one or more computing devices of the system can confirm, using at least one of the meter-tampering indicators, the likelihood that the electrical installations identified in step c) are non-conforming installations.

The second subclass called "detection of anomalies by comparison to the electrical profiles" (442 and 472) comprises ENC indicators of the "relational" type for single-phase installations and of the "relational" or "autonomous" type for multi-phase electrical installations. In general, in this subclass, the algorithmic processing of indicators aims to identify the differences between the various profiles coming from electrically neighboring installations.

For example, one of the single-phase relational indicators of this subclass analyzes the average voltage profiles of electrical installations over a certain period of time. In the event that the maximum difference between the average voltage levels of the installations is greater than a certain threshold and no electrical parameter justifies it, a potential ENC will be assigned to the installation being analyzed.

Figure 5:
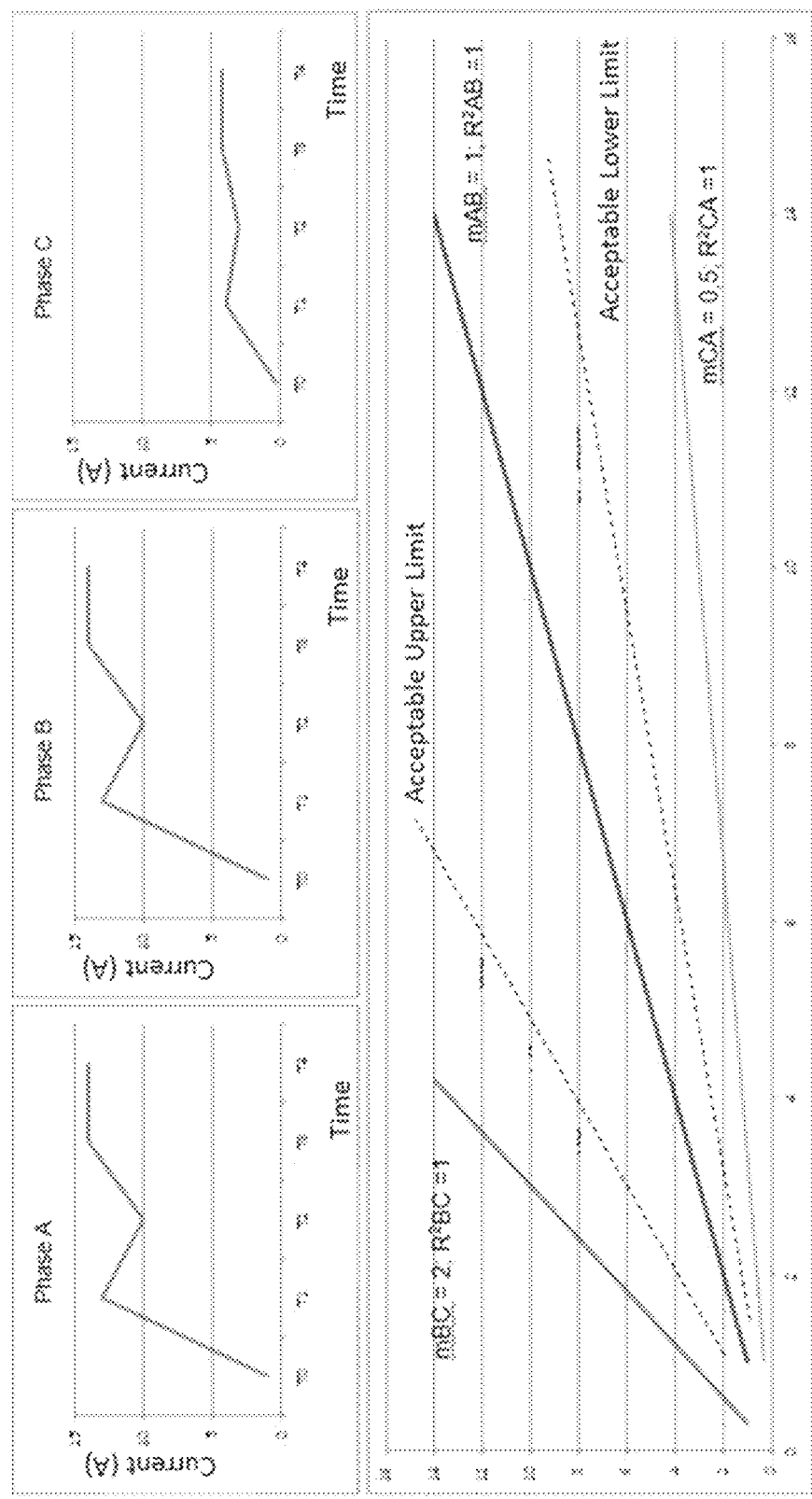
FIG. 5 shows an example of a graph generated for an ENC in a multi-phase installation where a de-balancing of the current profiles is observed.

1. Another example is an indicator, called a current ratio, which analyzes the current profiles of each of the supply phases of a multi-phase installation. This indicator can be used to identify multi-phase meters where at least one of the current profiles has a different average level from the other meters, while having an almost identical profile. As shown in FIG. 5, this indicator uses, in its algorithmic processing, the statistical notions of slopes ($m_{AB}$, $m_{BC}$, $m_{CA}$) and determination factors ($R^2_{AB}$, $R^2_{BC}$, $R^2_{CA}$) applied to the couples of the different current profile values. When the value of the determination factor is close to unity and the slope is outside the thresholds, a potential ENC is assigned to the installation being analyzed. The three graphs at the top of FIG. 5 show a case of a three-phase electrical installation for which the current profiles are similar for phases A, B and C. However, these same graphs also show a lower current level on phase C. These graphs illustrate that there may be potential ENC in the metering components of the electrical installation. FIG. 5 also shows an example of a graph that can be generated automatically (bottom image) showing the different statistical values used. Without being limited to the scope of the present invention, indicators for this second subclass may include: night-time consumption; voltage deviation of single-phase average values; voltage deviation of inter-phase average values; voltage deviation of inter-customer average values; voltage deviation of average values under a multi-phase transformer; voltage level at zero consumption; current ratio; and unsynchronized voltage loss and return. The one or more processing devices, part of system 180, can calculate at least one abnormality indicator listed above, by comparison. The system can validate, based on the at least one abnormality indicator, the likelihood that the electrical installations identified in step c) are non-conforming installations.

Figure 6:
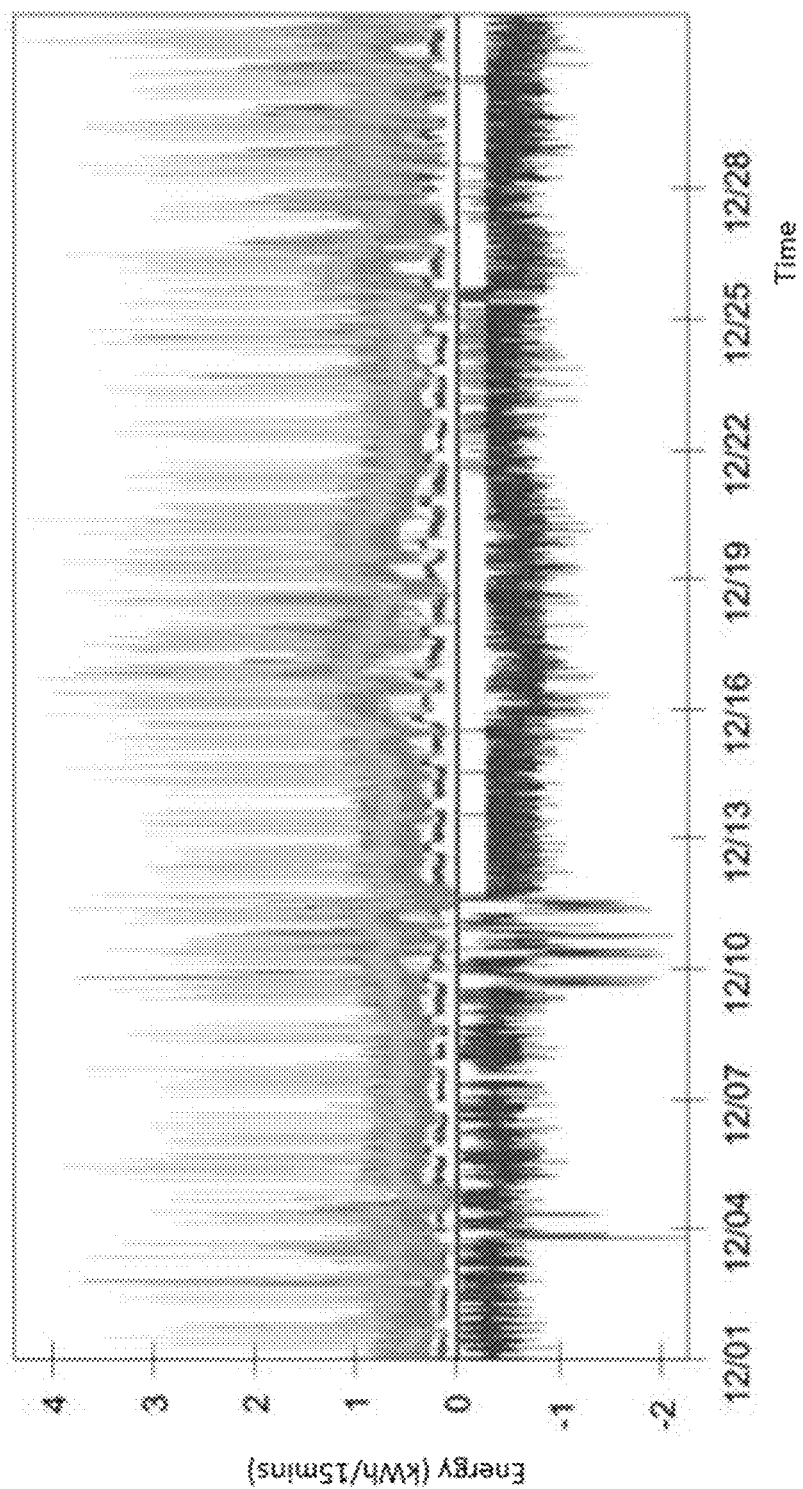
FIG. 6 shows a plurality of energy consumption profiles, one of which has negative values, indicating a high probability of inadequate connections.

The processing devices of the system can also be configured to calculate indicators of meter connection or unsuitable components. These indicators are part of a third subclass called "detection of inadequate meter connections or components" (443 and 473) is used to detect electrical installations with an inadequate electrical connection to the meter (single-phase installation) or to a component of the metering installation (multi-phase installation). An example of an indicator found in this subclass is one that aims to detect, under specific conditions, negative values in the consumption profiles of installations. The existence of these values in the consumption profiles is, with a high probability, due either to an inversion or half inversion of the meter connections (single-phase installation) or to an inversion of the metering sub-components (multi-phase installation). It should be noted here that under certain conditions, it is possible that negative energy values may be found in the consumption profiles of the electrical installations of electricity producers, transporters or distributors. For this reason, the latter are excluded from this type of analysis. FIG. 6 shows the power consumption profiles of some single-phase customer installations under the same distribution transformer. One of these installations shows negative values over the entire analysis period, which is impossible and therefore indicative of an anomaly. Other indicators of this subclass include: an absence of current, an absence of voltage, or zero voltage with current. The likelihood that an electrical installations is not conform can be validated or confirmed based on at least one of the indicators of meter connection or unsuitable components A fourth subclass called "detection of transient aberrations in electrical profiles" (444 and 474) includes indicators of a sudden and momentary change in an electrical variable that cannot be explained by other local or nearby electrical variables or by customer vector information. This subclass includes the indicator for the identification of large voltage variations. For example, algorithmic processing related to large voltage variations may include steps to calculate voltage variations, for a given profile, between two consecutive measurement periods; to retain variations that are above or below predetermined thresholds, to calculate the estimated energy required for these variations, and then to compare them with the measured energy values for these periods. A "large voltage deviation" non-conformance is detected for installations with voltage variations that do not correspond to the energy demand that should be associated with them.

Figure 7:
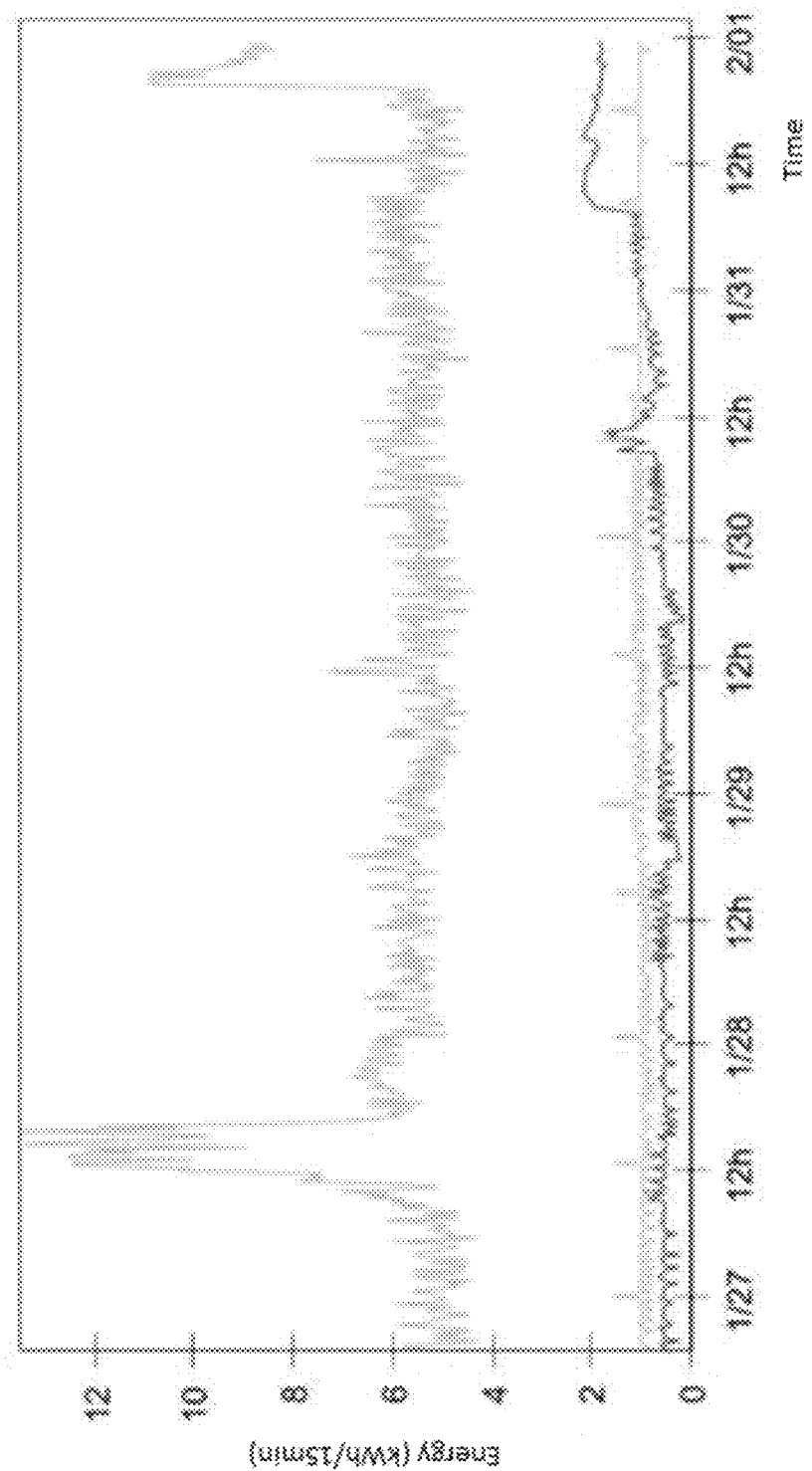
FIG. 7 shows a plurality of energy consumption profiles, one of which has values greater than the normalized maximum value.

A fifth subclass is called "detection of a non-standard operating-mode" (445 and 475), in which the indicators identify, in the electrical profiles, operating conditions deemed to be outside the operating standards specific to each electrical utility. For example, the algorithmic processing associated with the non-standard voltage indicators may include steps to calculate the average profile voltage for profiles with a non-zero current value; and compare the average profile voltage to predetermined minimum or maximum voltages. FIG. 7 provides a graphical example of a single-phase facility that, at peak, consumes more than 14 kWh/15 minutes, while the facility has a maximum capacity of 12 kWh/15 minutes at 100% of its payload (active energy consumption indicator). This subclass of indicators also makes it possible to identify average values, in voltage profiles, that exceed the values under marginal operating conditions defined by power system operators. Indicators in this category may include a dual-energy heating indicator; non-standard peak power; non-standard average voltage; single-connection transformer indicator; disparate determination factor; validation of active energy consumption; or non-standard voltage with current. The one or more computing devices can validate, on the basis of the at least one non-standard operating-mode indicator listed above, the likelyhood that the electrical installations identified are non-conforming installations.

Finally, a sixth subclass called "detection of non-conforming cyclic electrical charges" (446 and 476) includes indicators that identify, through the analysis of voltage and energy profiles, the presence of non-conforming cyclic charges. By non-conforming cyclic loads, it is understood to mean all cyclic loads that are not correctly measured by the meter or its components, through an alteration of the latter or their environment. Without being limited to the scope of the present invention, the algorithmic processing related to this type of indicators may, among others, include the calculation of the Fast Fourier Transform (FFT), the calculation of correlation and autocorrelation of profiles, the calculation of certain occurrences, the analysis and processing of voltage and energy profiles. The algorithmic processing of the indicators of this subclass is carried out for periods considered optimal for the specific search of an ENC on the distribution network.

Regardless of the classification, it is important to note that the application and management of the algorithmic processing proposed by this method (400) are complex, given the large volume of profiles to be processed and the number of indicators to be calculated. Data from hundreds of thousands, or even a few million electrical installations are analyzed. Obviously, this processing cannot be performed manually. A specialized software application, consisting of instructions that can be executed by one or more processors, including one or more ALUs (Arithmetic Logic Units), is essential for the realization of the proposed method.

In summary, the method (400) and the system described above, which includes a tangible and non-transitory product of a computer program (software application), make it possible to identify the electrical installations likely to exhibit an ENC. As described above, an indicator is the result of the execution of an algorithmic processing applied to electrical and thermal profiles (meteorological database). The estimation of certain indicators and the validation of the existence of certain ENCs are also made possible through the use of an additional database containing nominative data (or customer vectors). As outputs, the specialized application allows the identification of electrical installations requiring a field inspection or, depending on the degree of certainty of the ENC, an automatic interruption of the power supply to an installation.

The proposed method and system does not require any other components to be installed on the distribution system. This innovative feature significantly reduces the costs of deployment (acquisition) and use (replacement and maintenance) of the detection method compared to existing methods. The method and the system also make it possible to process large quantities of profiles, associated with a plurality of electrical installations in an automated way, with little or no human intervention. The proposed method and system automates the process of detection and identification of electrical installations likely to exhibit ENC, from the collection of profiles, the selection of indicators to be applied, the associated algorithmic calculations, the identification of electrical installations, and up to the automatic interruption (if necessary) of power to electrical installations confirmed as non-conforming.

Although concepts, data flows and methods associated with the invention and results have been illustrated in the attached drawings and described above, it will be apparent to people skilled in the art that modifications can be made to these achievements without departing from the invention.

The invention claimed is:

1. A method of automatically detecting electrical installations likely to exhibit an electrical non-conformity (ENC) on an electrical distribution system, the electrical installations being connected to meters, the method comprised of the steps of:
   a) retrieving, from a database associated with a meter data management system, electrical profiles associated with the electrical installations, the profiles being generated by said meters deployed by electrical utilities for billing purposes, the profiles being spread over time;
   b) recovering, from a database, nominative data characterizing the electrical installations;
   c) applying, using one or more computing devices, algorithmic processing associated with ENC indicators determined according to target conditions, on the electrical profiles collected in step a), in order to obtain data indicative of different types of ENC;
   d) detecting, by the one or more computing devices, from the data obtained in step c), the electrical installations likely to exhibit an ENC, when the target conditions are met;
   e) confirming or denying, by the one or more computing devices, that the electrical installations detected are indeed likely to exhibit an ENC, by cross-referencing said nominative data with the indicators of an ENC having met their target conditions; and
   f) generating, by the one or more computing devices, a structure of results including data indicative of the different types of potential ENCs identified for each electrical installation having met their target conditions;
   the method requiring only electrical profiles collected from the meters, and the one or more computing devices, to identify electrical installations likely to be non-conforming, without the use of any other sub-metering equipment.

2. The method according to claim 1, wherein the nominative data includes at least one of the following information, for each of the electrical installations: nature of the electrical installation among single-phase or multi-phase; tariff to which the electrical installation is subject; purpose of the building(s) associated with the electrical installation, among a residential purpose, a commercial purpose, an institutional purpose or an industrial purpose; and main source of energy used to heat the building(s).

3. The method according to claim 2, including a step of selecting, via the one or more computing devices, the ENC indicators to be applied to the profiles based on information contained in the nominative data.

4. The method according to claim 3, comprising a step of recovering, from external databases, meteorological data, and a step of confirming or denying, by the one or more computing devices, that the identified electrical installations are indeed likely to exhibit an ENC, by cross-referencing the said meteorological data with the ENC indicators having met their target conditions.

5. The method according to claim 4, in which the meteorological data includes at least one of the following information: a local outdoor temperature; a date; a time determined at the time the profiles were generated.

6. The method according to claim 3, including a step of detecting the nature of the electrical installations as single-phase, two-phase or multi-phase, based on the collected profiles and/or nominative data.

7. The method according to claim 6, in which the electrical profiles from single-phase and two-phase installations include at least voltage (in V) and active energy (in kWh) profiles.

8. The method according to claim 7, in which, for multi-phase electrical installations, the recovered profiles comprise the total active energy (in kWh) and per electrical phase ($\phi_A$, $\phi_B$, $\phi_C$), a measure of total apparent energy (in kVAh) and per electrical phase, a measure of reactive energy (in kVARh) total and per electrical phase, a measure of voltages (in V) per phase and a measure of current (in A) per phase.

9. The method according to claim 1, in which a part of the ENC indicators are stand-alone indicators, the stand-alone indicators corresponding to those whose algorithmic processing involves only data from the profiles of the electrical installation being analyzed.

10. The method according to claim 9, in which a part of the ENC indicators are relational indicators, the relational indicators corresponding to those involving the profiles of neighbouring installation, connected to the same distribution transformer, electrical phase, power line or distribution station.

11. The method according to claim 10, wherein in step c), part of the algorithmic processing is associated with a first class of ENC indicators called positioning indicators, the method comprising calculating, by the one or more computing devices, at least one positioning indicator, and determining whether:
   a given one of the electrical installations is located on the power line being analyzed, but is connected to a transformer other than the one defined in the nominative data; or
   a given one of the electrical installations is not connected to the power line being analyzed;
   the method also comprising a step of confirming, by the one or more computing devices, using the at least one positioning indicator, the likelihood that the electrical installations identified in step d) are non-conforming installations.

12. The method according to claim 11, wherein in step c) a part of the algorithmic processing is associated with a second class of ENC indicators called state indicators, the method comprising calculating by the one or more computing devices, at least one of the following state indicators:
   an energy data capture rate;
   a voltage data capture rate;
   a voltage debalancing;
   a current debalancing;
   a ratio of apparent and active energy;
   the method also comprises a step of confirming, based on the at least one state indicator, the likelihood that the electrical installations identified in step d) are non-conforming installations.

13. The method according to claim 12, wherein in step c), a part of the algorithmic processing are associated with a first subclass of non-technical loss indicators, the method comprising calculating, by the one or more computing devices, at least one meter-tampering indicator of a meter-tampering or faulty meter, among:
   an alteration of the voltage coil;
   an identical energy data;
   an identical voltage data;
   a resistance in series on current transformer; and
   a zero three-phase current with non-zero consumption;
   the method also comprising a step of confirming, by the one or more computing devices, using the at least one meter-tampering indicator, the likelihood that the electrical installations identified in step d) are non-conforming installations.

14. The method according to claim 13, wherein in step c), a part of the algorithmic processing is associated with a second subclass of non-technical loss indicators, the method comprising calculating, by the one or more computing devices, at least one abnormality indicator by comparison among:
   a night consumption;
   a voltage deviation from single-phase mean values;
   a voltage deviation of the inter-phase mean values;
   a voltage deviation of the inter-customer mean values;
   a voltage deviation of average values of a multi-phase transformer;
   a voltage level at net-zero consumption;
   a current ratio; and
   a unsynchronized voltage loss and return;
   the method also includes a step to validate, by the one or more computing devices, based on the at least one abnormality indicator, the likelihood that the electrical installations identified in step d) are non-conforming installations.

15. The method according to claim 13, wherein in step c), a part of the algorithmic processing are associated with a third subclass of non-technical loss indicators, the method comprising calculating, by the one or more computing devices, at least one indicator of meter connection or unsuitable components from among:
   a no current;
   no voltage;
   negative energy data;
   zero voltage with current;
   the method further comprising a step to validate, by the one or more computing devices, from the at least one indicator of meter connection or unsuitable components, the likelihood that the electrical installations identified in step d) are non-conforming installations.

16. The method according to claim 13, wherein in step c) a part of the algorithmic processing is associated with a fourth subclass of non-technical loss indicators, the method comprising calculating, by the one or more processing devices, a transient-aberrations indicator by identifying large voltage deviations on said profiles,
   the method comprising a step of confirming, based on the transient-aberrations indicator, the likelihood that the electrical installations identified in step d) are non-conforming installations.

17. The method according to claim 13, wherein in step c), a part of the algorithmic processing are associated with a fifth subclass of non-technical loss indicators, the method comprising calculating, by the one or more computing devices, at least one non-standard operating-mode indicator from among:
   dual-energy heating indicator;
   non-standard peak power;
   non-standard average voltage;
   single-connection transformer;
   disparate determination factor;
   validation of active energy consumption;
   non-standard voltage with current;
   the method also comprising validating, by the one or more computing devices, on the basis of the at least one non-standard operating-mode indicator, the likelihood that the electrical installations identified in step d) are non-conforming installations.

18. The method according to claim 13, wherein in step c), a part of the algorithmic processing are associated with a sixth subclass of non-technical loss indicators, the method comprising calculating, by the one or more computing devices, at least one non-conforming cyclic electrical charge detection indicator from among:
   a Fourrier transformation applied on voltage and energy measurements for given periods (cycles);
   a presence of cyclic voltage without power demand;
   the method also comprising confirming, by the one or more computing devices, on the basis of the at least one non-conforming cyclic electrical charge detection indicator, the likelihood that the electrical installations identified in step d) are non-conforming installations.

19. The method according to claim 13, comprised of a step of generating graphs visually representing the indicators of ENCs having met the target conditions.

20. The method according to claim 19, including a step of generating, via a software application, requests for inspection of electrical installations identified as likely to exhibit an ENC.

21. The method according to claim 19, including a step of assigning priority to electrical installations identified as likely to exhibit an ENC, based on a degree of certainty as to the existence of an ENC for a given installation, the degree of certainty being related to the number, occurrence and type of indicators of an ENC having met the target conditions.

22. The method according to claim 21, comprising reading, by the meters, measurements constituting the electrical profiles of the meters at least once per hour.

23. The method according to claim 22, including a step of automatically interrupting, via instruction signals generated from the one or more computing devices, the supply of electricity for at least some of the electrical installations identified in step d).

24. The method according to claim 23, in which the step of interrupting the supply of electricity involves sending a request to open a control element located in the meter related to the electrical installation determined to be non-conforming.

25. A system for automatically identifying electrical installations likely to exhibit an electrical non-conformity (ENC) on an electrical distribution network, the system comprised of at least one algorithmic processing unit having a processor and a memory in communication with the processor, the memory comprising instructions executable by the processor to carry out the steps of:
- a) retrieving electrical profiles associated with electrical installations, the profiles being generated by said meters deployed by electrical utilities for billing purposes, the profiles being spread in time;
- b) recovering nominative data characterizing the electrical installations;
- c) applying algorithmic processing associated with ENC indicators determined according to target conditions, on the electrical profiles collected in step a), to obtain data indicative of different types of ENC;
- d) identifying, from the data obtained in step c), the electrical installations likely to exhibit an ENC, when the target conditions are met;
- e) confirming or denying that the electrical installations identified are indeed likely to exhibit an ENC, by cross-referencing said nominative data with the indicators of an ENC having met their target conditions;
- f) generating, by the one or more computing devices, a structure of results including data indicative of the different types of potential ENCs identified for each electrical installation having met their target conditions;
- the system requiring only the profiles retrieved from the meters and at least one algorithmic processing unit(s) to identify electrical installations likely to be non-conforming, without the use of any other sub-metering equipment.

26. The system according to claim 25, including one or more databases for storing: calculated ENC indicators; electrical profiles generated by meters; and unique identifiers associated with electrical installations in a power grid that are likely to exhibit an ENC.

27. The system according to claim 26, further comprising at least one display linked directly or indirectly to at least one processing unit(s), the memory further comprising executable instructions by the processor to display on a display screen a user interface for receiving a selection of ENC indicators to be applied to the electrical profiles, the selection including all or part of the profiles to which the algorithmic processing associated with the selected indicators is to be applied, and for displaying the unique identifiers of electrical installations identified as likely to be non-conforming.

28. The system according to claim 27, comprising an output for sending a request to open a control element located in the meter related to the electrical installation determined to be non-conforming.

29. A tangible and non-transitory computer readable medium embodying a computer program product for automatically identifying installations likely to exhibit an ENC on an electrical distribution network, containing instructions executable by a processor to perform the steps of:
- a) retrieving electrical profiles associated with electrical installations, the profiles being generated by meters deployed by electrical utilities for billing purposes, the profiles being staggered in time;
- b) recovering, from a database, nominative data characterizing the electrical installations;
- c) applying, by one or more processing devices, algorithmic processing associated with ENC indicators determined according to target conditions, on the electrical profiles retrieved in step (a), to obtain data indicative of different types of ENC;
- d) identifying, from the data obtained in step c), the said electrical installations likely to exhibit an ENC, when the target conditions are met;
- e) confirming or denying, by the one or more computing devices, that the electrical installations identified are indeed likely to exhibit an ENC, by cross-referencing said nominative data with the indicators of an ENC having met their target conditions; and
- f) generating, by the one or more computing devices, a structure of results including data indicative of the different types of potential ENCs identified for each electrical installation having met their target conditions;
- the tangible and non-transitory product of a computer program requiring only electrical profiles collected from the meters, and the one or more computing devices, to identify electrical installations likely to be non-conforming, without the use of any other sub-metering equipment.

* * * * *